United States Patent [19]
Tran

[11] Patent Number: 5,901,092
[45] Date of Patent: May 4, 1999

[54] MEMORY DEVICE HAVING PIPELINED ACCESS AND METHOD FOR PIPELINING DATA ACCESS

[75] Inventor: Luan C. Tran, Meridian, Id.

[73] Assignee: Micron Technology, Inc., Boise, Id.

[21] Appl. No.: 08/917,036

[22] Filed: Aug. 22, 1997

[51] Int. Cl.$^6$ .................................................. G11C 7/00
[52] U.S. Cl. ......................... 365/195; 365/194; 365/196; 365/205
[58] Field of Search .................................... 365/194, 195, 365/205, 210, 196, 207

[56] References Cited

U.S. PATENT DOCUMENTS

| | | | |
|---|---|---|---|
| 4,811,290 | 3/1989 | Watanabe | 365/205 |
| 5,557,580 | 9/1996 | Numaga et al. | 365/194 |
| 5,682,353 | 10/1997 | Eitan et al. | 365/233 |
| 5,748,551 | 5/1998 | Ryan et al. | 365/230.06 |

*Primary Examiner*—David Nelms
*Assistant Examiner*—David Lam
*Attorney, Agent, or Firm*—Seed and Berry LLP

[57] ABSTRACT

In one embodiment of the invention, a word line is coupled to a row of memory cells, and some of the memory cells are accessed before the firing signal has propagated all the way to the back end of the word line. In another embodiment of the invention, a circuit includes a memory row that has a plurality of memory cells, and a word line that is coupled to the memory cells. The word line has a front end and a back end, and is coupled to receive a row-activate signal that propagates from the front end to the back end. The circuit also includes an enable circuit that is operable to prohibit a data transfer to or from a memory cell approximately until the row-activate signal arrives at the memory cell, and is operable to prohibit a data transfer to or from another memory cell approximately until the row-activate signal arrives at the other memory cell.

41 Claims, 5 Drawing Sheets

MEMORY DEVICE HAVING PIPELINED ACCESS AND METHOD FOR PIPELINING DATA ACCESS

TECHNICAL FIELD

The invention relates generally to memory devices and more particularly to a memory device that has distributed sensing of word-line firing delay. Such distributed sensing allows data stored in memory cells that are near the front end of a word line to be accessed before the firing signal propagates to the back end of the word line.

BACKGROUND OF THE INVENTION

As technology advances, designers continue to demand memory devices that have faster data access times so that they can design faster electronic systems. FIG. 1 is a schematic diagram of a conventional memory array 10 for a dynamic random access memory (DRAM). The array 10 includes a plurality of memory cells 12, which each include an access transistor 14 and a storage capacitor 16, and which are each coupled to one of two complementary digit lines 18a, b, a word line 20, and a cell plate (not shown) that is biased at a cellplate voltage $V_{cp}$. Each complementary pair of digit lines 18 is coupled to a sense amplifier 24, which amplifies the data level on the pair of digit lines 18 so that a read/write circuit 26 can read data from an addressed cell 12. An address decoder 27 activates a word line driver 28 that is associated with the row containing the addressed cell 12. The activated driver 28 generates an active signal level on the word line 20, i.e., fires the word line 20, to enable the addressed cell 12 for a data transfer between itself and the read/write circuit 26.

Each word line 20 has a finite propagation delay associated therewith. A parasitic capacitor 22, which is shown in dashed line, is associated with each memory cell 12 and is modeled as being coupled between the control terminal of the access transistor 14 and ground. Furthermore, a distributed impedance, which is modeled by the resistors 30 shown in dashed line, is associated with each word line 20. Because of the time constant formed by the distributed impedance and the parasitic capacitance, the active level of the firing signal takes a finite amount of time to propagate from the word-line front end, which is coupled to the output of the associated driver 28, to the word-line back end, which is typically coupled to the last cell 12 in the row.

To prevent this word-line delay from causing any data errors, such as may be caused by trying to read an addressed memory cell 12 that is not yet enabled, the array 10 does not enable the sense amplifiers 24 until the firing signal has propagated to the back end of the selected word line 20. To perform this delayed enable of the sense amplifiers 24, the address decoder 27 activates a simulation driver 32 substantially simultaneously with the word-line driver 28. The activated driver 32 generates a "dummy" firing signal that is provided to the input of a word-line-delay simulator 34, which mimics the delay of the fired word line 20. When the simulator 34 determines that the firing signal should have reached the end of the selected word line 20, it turns on a transistor 36, which generates a sense amplifier supply voltage $V_{SA}$. In this example, $V_{SA}$ is approximately equal to ground in a steady state. Thus, as long as the simulator 34 accurately estimates the total propagation time of the firing signal, the sense amplifiers 24 are enabled only after all of the cells 12 in the addressed row are enabled.

There are a number of conventional circuits that can be used for the simulator 34. For example, the simulator 34 may include a dummy word line (not shown in FIG. 1) that is the same length as, and thus has the same distributed impedance as, the word lines 20. Such a dummy word line is coupled to the same number of dummy memory cells (not shown in FIG. 1) as there are storage cells 12 in each row. The dummy cells have the same structure as, and thus the same parasitic capacitance as, the cells 12. Therefore, because the time constants associated with the selected word line 20 and the dummy word line are substantially the same, the dummy firing signal reaches the back end of the dummy word line at substantially the same time as the firing signal reaches the back end of the selected word line 20. Therefore, when the dummy firing signal reaches the back end of the dummy word line, the simulator 34 activates the transistor 36.

One problem with such a simulator 34 is that no data in the addressed row can be accessed until the firing signal propagates all the way to the back end of the selected word line 20. For example, the propagation delay from the front end to the back end of the selected word line 20 may be 8 nanoseconds (ns) or greater. Therefore, there is a delay of at least 8 ns from the time the address decoder 27 fires the selected word line 20 until any addressed memory cell 12 can be accessed even though the memory cells 12 near the front end could be accessed much earlier.

A second problem is that the simultaneous coupling of all the sense amplifiers 24 to ground via the transistor 36 may cause a momentary current surge that is large enough to temporarily alter the voltage level of $V_{SA}$ from its desired level. Such a voltage spike can negatively affect the operation of the memory array 10, other circuits of the memory device, and other devices in the system that incorporates the memory device.

SUMMARY OF THE INVENTION

In one embodiment of the invention, a word line is coupled to a row of memory cells, and some of the memory cells are accessed before the firing signal has propagated all the way to the back end of the word line. In another embodiment of the invention, a circuit includes a memory row that has a plurality of memory cells, and a word line that is coupled to the memory cells. The word line has a front end and a back end, and is coupled to receive a row-activate signal that propagates from the front end to the back end. The circuit also includes an enable circuit that is operable to prohibit a data transfer to or from a memory cell approximately until the row-activate signal arrives at the memory cell, and is operable to prohibit a data transfer to or from another memory cell approximately until the row-activate signal arrives at the other memory cell.

Thus, such a circuit can enable a memory cell as soon as the firing signal propagates to the coupling junction between that memory cell and the word line. The circuit need not wait until the firing signal has propagated to the back end of the word line. Therefore, external circuitry can access the data in a pipelined fashion starting with the memory cells near the front end of the word line and working toward the memory cells near the back end of the word line. Furthermore, because the circuit accesses a memory cell or groups of memory cells as the firing signal travels down the word line, not all of the sense amplifiers are activated at the same time. This distributed activation of the sense amplifiers reduces the peak current drawn from the sense-amp supply and thus decreases the chances of voltage spikes that can negatively affect the circuit, other sections of the device that includes the circuit, or the system that incorporates this device. Likewise, the data that are available in the I/O circuits are clocked out in a pipelined fashion, therefore reducing the spiking current or ground-bounce in the I/O drivers.

DETAILED DESCRIPTION OF THE INVENTION

Figure 1:
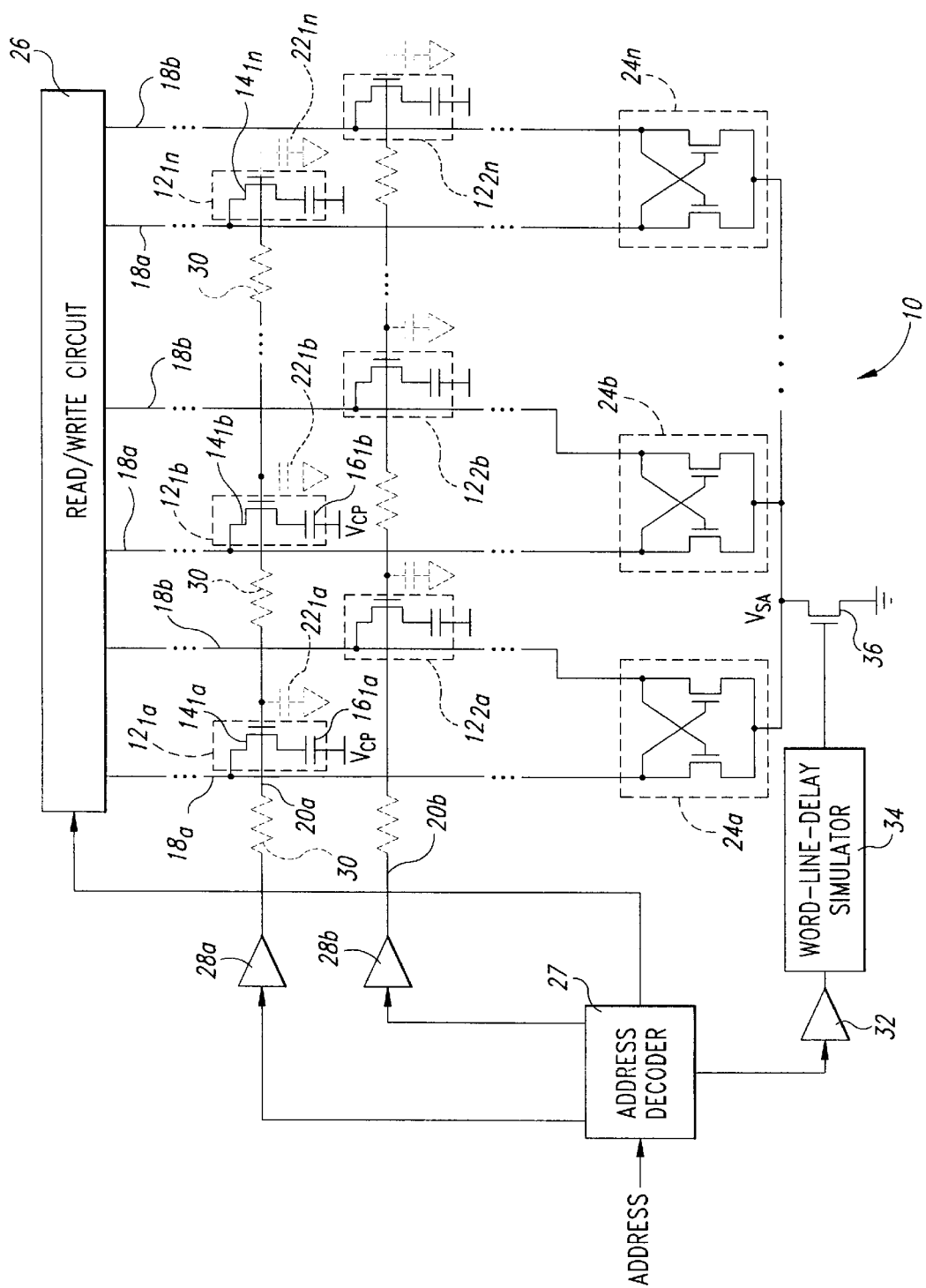
FIG. 1 is a schematic diagram of a conventional dynamic memory array.
Figure 2:
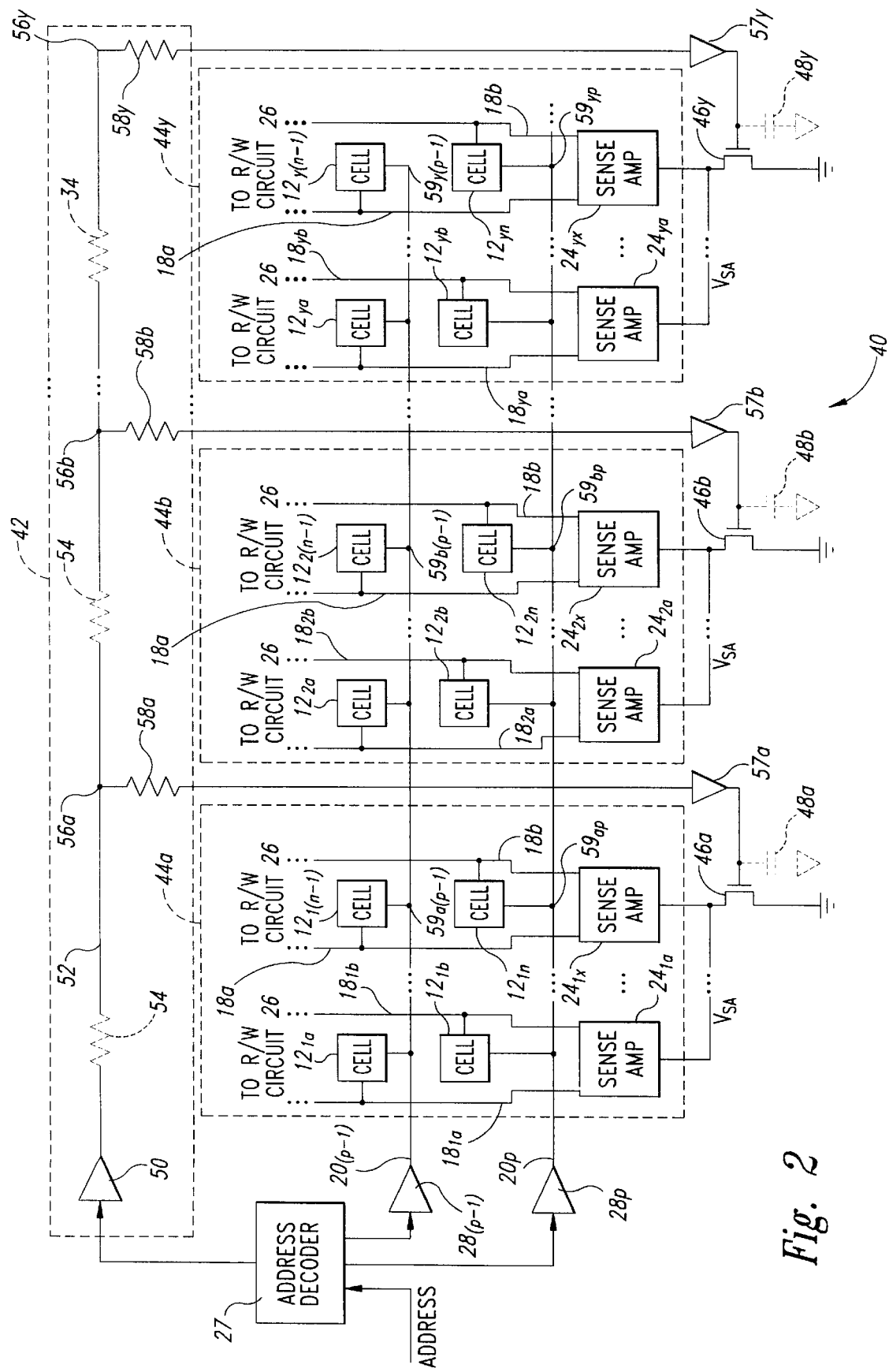
FIG. 2 is a schematic diagram of a memory array according to one embodiment of the invention.

FIG. 2 is a schematic diagram of a memory array 40 according to one embodiment of the invention. The array 40 may be part of a memory circuit such as a synchronous dynamic random access memory (SDRAM), or may be part of another circuit such as a processor. Furthermore, like reference numbers are used in FIG. 2 to mark components that are the same or similar to those shown in FIG. 1. For clarity, the array 40 is shown and discussed as a dynamic array of memory cells 12 that are similar in structure and operation to the cells 12 of FIG. 1.

The digit lines 18 of the array 40 are arranged in groups 44a–44y, which each include n digit lines 18 that form a predetermined number of columns. In conventional terminology, a single column provides the number of bits that are simultaneously made available by the array 40 during a read or write cycle. For example, where the array 40 is a 32-bit dynamic array, then one column provides 32 bits, and thus includes 32 pairs of digit lines 18 and 32 sense amplifiers 24, one for each pair of digit lines 18. Similarly, if the array 40 is a 32-bit static array, then to provide 32 bits, one column includes 32 pairs of digit lines 18 and 32 sense amplifiers 24. Although there is no restriction as to the number or size of such columns in a group 44, in a preferred embodiment of the invention, each group 44 includes the same number of same-sized columns, the preferred number being from 1 to 16, the preferred size being 32 bits, for an optimum tradeoff between a number of same-sized columns and die area.

The sense amplifiers 24a–24x in each column group 44 are coupled to VSA, which is generated via a respective enable transistor 46a–46y. In the illustrated embodiment, VSA is approximately equal to ground, i.e., 0 volts, in the steady state. Each of the transistors 46 has a parasitic capacitance that is modeled as a respective capacitor 48a–48y, which are shown in dashed line and as coupled between the gate of a respective transistor 46 and ground.

The memory array 40 also includes a word-line-delay simulator 42 according to one embodiment of the invention. The simulator 42 includes a driver 50, which receives an activation signal from the address decoder 27 and which generates a dummy firing signal at the front end of a dummy word line 52. The distributed impedance of the dummy word line 52 is represented by the resistors 54, which are shown in dashed line. The dummy word line 52 also includes a number of tap terminals 56a–56y, one for each group 44a–44y. Impedances 58a–58y, which may be conventionally formed from polysilicon or other materials, or in a small active driver to prevent loading of the model word line, are each coupled between a respective tap terminal 56 and the gate of an associated transistor 46. In one embodiment, optional local drivers 57a–57y are respectively coupled between the impedances 58a–58y and the gates of the transistors 46a–46y. The values of the impedances 58 are conventionally calculated based on the values of the capacitors 48 and resistors 54 (and the delays of the drivers 57a–57y when present), and are such that the dummy firing signal reaches the gates of the transistors 46 at approximately the same time that the firing signal reaches the corresponding coupling-junction points 59a–59y on the word lines 20a–20p (only lines 20(p-1) and 20p shown for clarity). The junctions 59 are the coupling points between the word lines 20 and the "last" memory cell 12 that the firing signal propagates to in each group 44. For example, in approximately the same time it takes a firing signal to propagate to the junction 59ap on the word line 20p, the dummy firing signal travels down the dummy word line 52 to the tap 56a, and, via the impedance 58a, charges the parasitic capacitor 48a to a voltage level sufficient to turn on the sense-amp enabling transistor 46a.

In operation, when the address decoder 27 activates a word line driver 28, it also activates the dummy word line driver 50 at approximately the same time. Thus, the selected word line 20, for example the word line 20p, and the dummy word line 52 are fired substantially simultaneously. Therefore, at approximately the same time that the firing signal arrives at the junction 59ap, the dummy firing signal turns on the transistor 46a. The active transistor 46a enables the sense amplifiers $24_{1a}$–$24_{1x}$, and thus enables the transfer of data to or from the addressed memory cells 12 in the column group 44a. Likewise, the enabling of the remaining column groups 44b–44y occurs in a similar fashion and in sequential order as the firing signal and the dummy firing signal propagate down the word line 20p and the dummy word line 52 respectively. Therefore, data transfers can take place before the firing signal has propagated to the back end of the word line 20p.

This technique allows the pipelined transfer of data to or from an activated row of memory cells 12. Such a technique is particularly useful in burst mode DRAMs and SDRAMs, which usually access a whole row of data at a time. For example, while the addressed memory cells 12 that are coupled to the word line 20p and that are in the group 44a are being accessed, the firing signal has sufficient time to propagate to the junction 59bp on the word line 20p so that there is little or no delay between sequential data accesses. The only significant delay is that between the addressing of the memory cells 12 by the decoder 27 and the first data access from the cells 12 in the column group 44a. This minimal delay is approximately equal to the sum of the decoder 27 delay, the driver 28 delay, and the firing-signal propagation delay from the front end of the word line 20p to the junction 59ap. Thereafter, the data is sequentially pipelined out of the groups 44b–44y with no intermediate delays. Furthermore, while the addressed cells 12 in the last group 44y are being accessed, a next word line 20 can be fired so that the data pipeline can continue substantially delay free. Thus, any number of rows can be sequentially accessed with the only significant delay being the initial delay associated with the first-addressed row.

Additionally, because only the sense amplifiers 24 in one group 44a–44y are activated at any one time, the magnitudes of the peak current surges from $V_{SA}$ to ground are greatly reduced, as are the chances that voltage spikes caused by these surges will negatively affect the operation of the array 40 or other circuits.

Figure 3A:
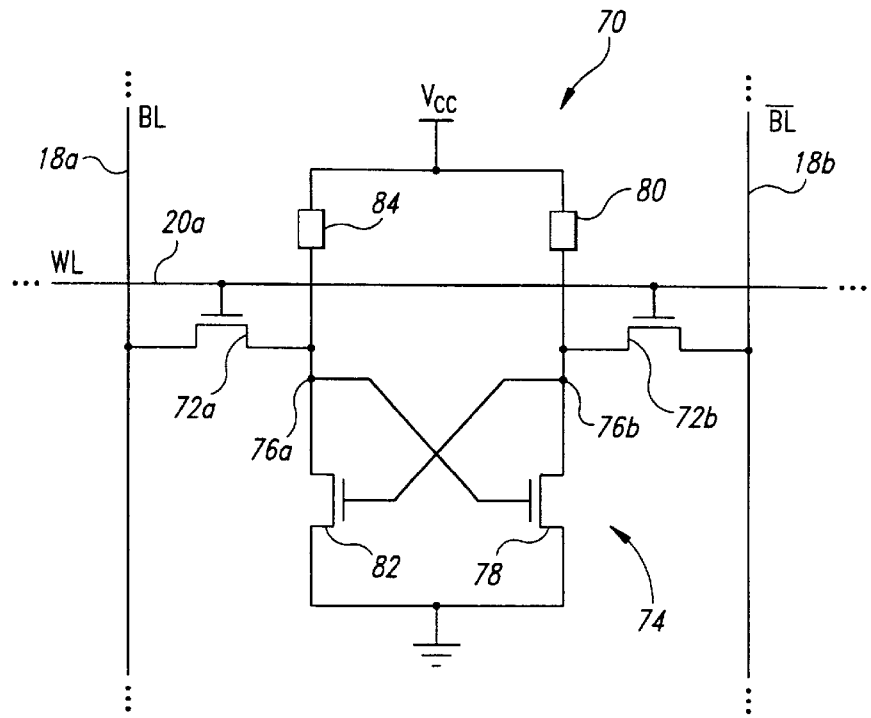
FIG. 3A is a schematic diagram of one embodiment of a memory cell of FIG. 2.
Figure 3B:
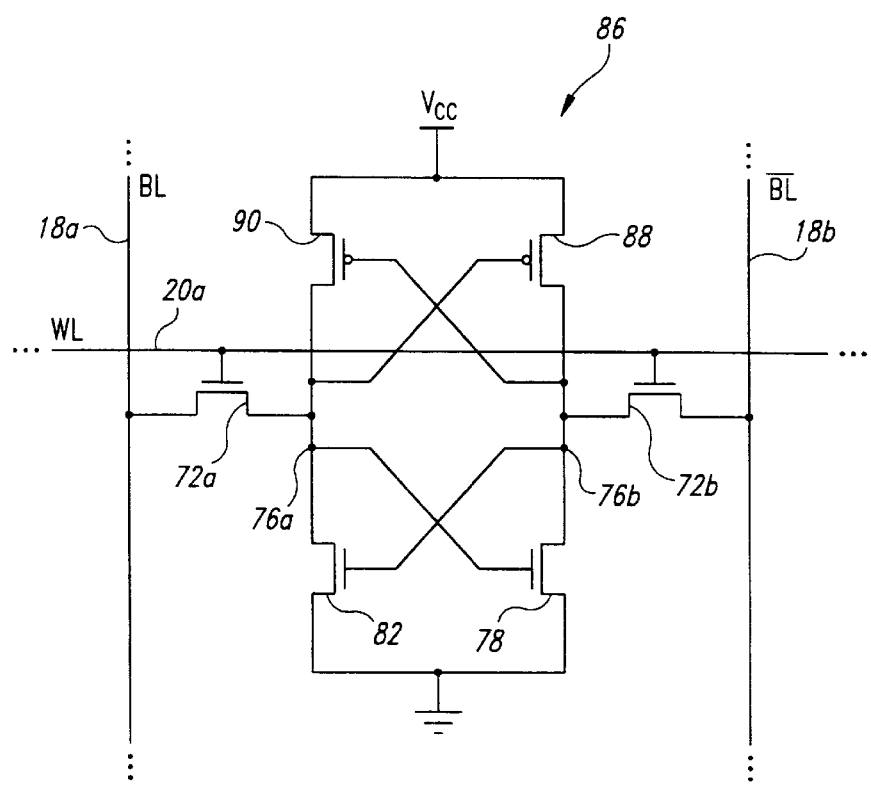
FIG. 3B is a schematic diagram of another embodiment of a memory cell of FIG. 2.

Referring to FIGS. 3A and 3B and as described above, the memory cells 12 of the array 40 of FIG. 2 may be of the static type instead of the dynamic type shown in FIG. 1. One of the major differences is that static type cells are each coupled to two digit lines 18, a digit-true line and a digit-complement line, instead of one digit line 18. Conversely, a dynamic-type cell is coupled to either a digit-true line or a digit-complement line, but not both. But otherwise, such a static array 40 has a similar structure and operation as described above in conjunction with FIG. 2 for the dynamic array 40.

FIG. 3A is a schematic diagram of a conventional 4-transistor SRAM-type memory cell 70, which can be used for the memory cells 12 in FIG. 2. The 4-T cell 70 includes a pair of NMOS access transistors 72a and 72b, which respectively couple the storage portion 74 of the cell 70 to the true and complement bit lines 18a and 18b during data access of the cell 70. The storage portion 74 uses positive feedback to store a data value at a node 76a and a complementary data value at a node 76b. For example, when the value at the node 76a is a logic 1, ie., $V_{CC}$, an NMOS transistor 78 is on and thus drives the node 76b to a logic 0, i.e., ground. A load 80 limits the current that flows between the power supply $V_{CC}$ and ground to an acceptable level, typically on the order of a few tens of microamps (uA). The logic 0 on the node 76b deactivates an NMOS transistor 82, which acts as an open circuit between the node 76a and ground. A load device 84 completes the feedback loop by pulling up the node 76a to logic 1.

During a read of the cell 70, the logic levels on the nodes 76a and 76b are read via digit lines 18a and 18b, respectively. During a write, the desired logic levels are driven onto the nodes 76a and 76b until the cell 70 acquires the desired state.

FIG. 3B is a schematic diagram of a 6-transistor SRAM-type memory cell 86, which is similar in structure and operation to the cell 70 of FIG. 3A except that the loads 80 and 84 are respectively replaced with PMOS transistors 88 and 90. The transistors 88 and 90 usually cause the 6-T cell 86 to draw a significantly lower quiescent current than the 4-T cell 70.

Figure 4:
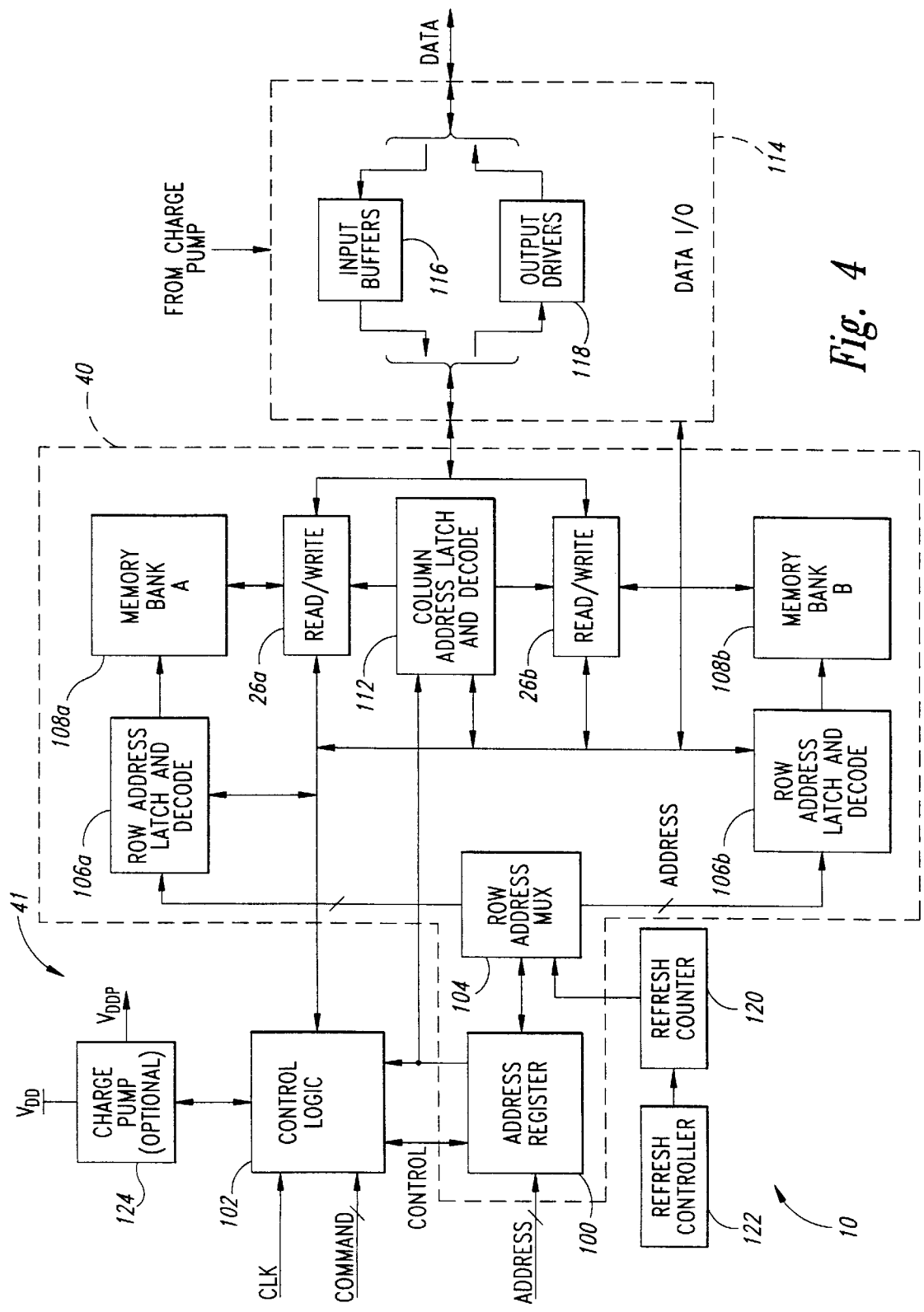
FIG. 4 is a block diagram of one embodiment of a memory circuit that incorporates the memory array of FIG. 2.

FIG. 4 is a block diagram of one embodiment of a memory device 41, which incorporates the array 40 of FIG. 2. In one embodiment of the invention, the memory device 41 is an SDRAM, although it may be another type of memory in other embodiments of the invention.

The memory device 40 includes an address register 100, which receives an address from an ADDRESS bus. Control logic circuit 102 receives a clock (CLK), receives clock enable (CKE), chip select ($\overline{CS}$), row address strobe ($\overline{RAS}$), column address strobe ($\overline{CAS}$), and write enable ($\overline{WE}$) from the COMMAND bus, and communicates with the other circuits of the memory device 41. A row-address multiplexer 104 receives the address signal from the address register 100, and provides the row address to the row-address latch-and-decode circuits 106a and 106b for either a first memory bank 108a or a second memory bank 108b, respectively. During read and write cycles, the row-address latch-and-decode circuits 106a and 106b activate the word lines of the addressed rows of memory cells in the memory banks 108a and 108b, respectively. Read/write circuits 26a and 26b read data from the addressed memory cells in the memory banks 108a and 108b, respectively, during a read cycle, and write data to the addressed memory cells during a write cycle. A column-address latch-and-decode circuit 112 receives the address from the address register 100 and provides the column address of the selected memory cells to the read/write circuits 26a and 26b. For clarity, the address register 100, the row-address multiplexer 104, the row-address latch-and-decode circuits 106a and 106b, and the column-address latch-and-decode circuit 112 can be collectively referred to as the address decoder 27 of FIG. 2.

A data input/output (I/O) circuit 114 includes a plurality of input buffers 116. During a write cycle, the buffers 116 receive and store data from the DATA bus, and the read/write circuits 26a and 26b provide the stored data to the memory banks 108a and 108b, respectively. The data I/O circuit 114 also includes a plurality of output drivers 118. During a read cycle, the read/write circuits 26a and 26b provide data from the memory banks 108a and 108b, respectively, to the drivers 118, which in turn provide this data to the DATA bus.

A refresh counter 120 stores the address of the row of memory cells to be refreshed either during an auto-refresh mode or a cell-refresh mode. After the row is refreshed, a refresh controller 122 updates the address in the refresh counter 120, typically by either incrementing or decrementing the contents of the refresh counter 120. Although shown separately, the refresh controller 122 may be part of the control logic 102 in other embodiments of the memory device 41.

The memory device 41 may also include an optional charge pump 124, which steps up the power-supply voltage $V_{DD}$ to a voltage $V_{DDP}$. In one embodiment of the invention, the pump 124 generates $V_{DDP}$ approximately 1–1.5 V higher than $V_{DD}$. The memory device 41 may also use $V_{DDP}$ to overdrive selected internal transistors in a conventional manner.

Figure 5:
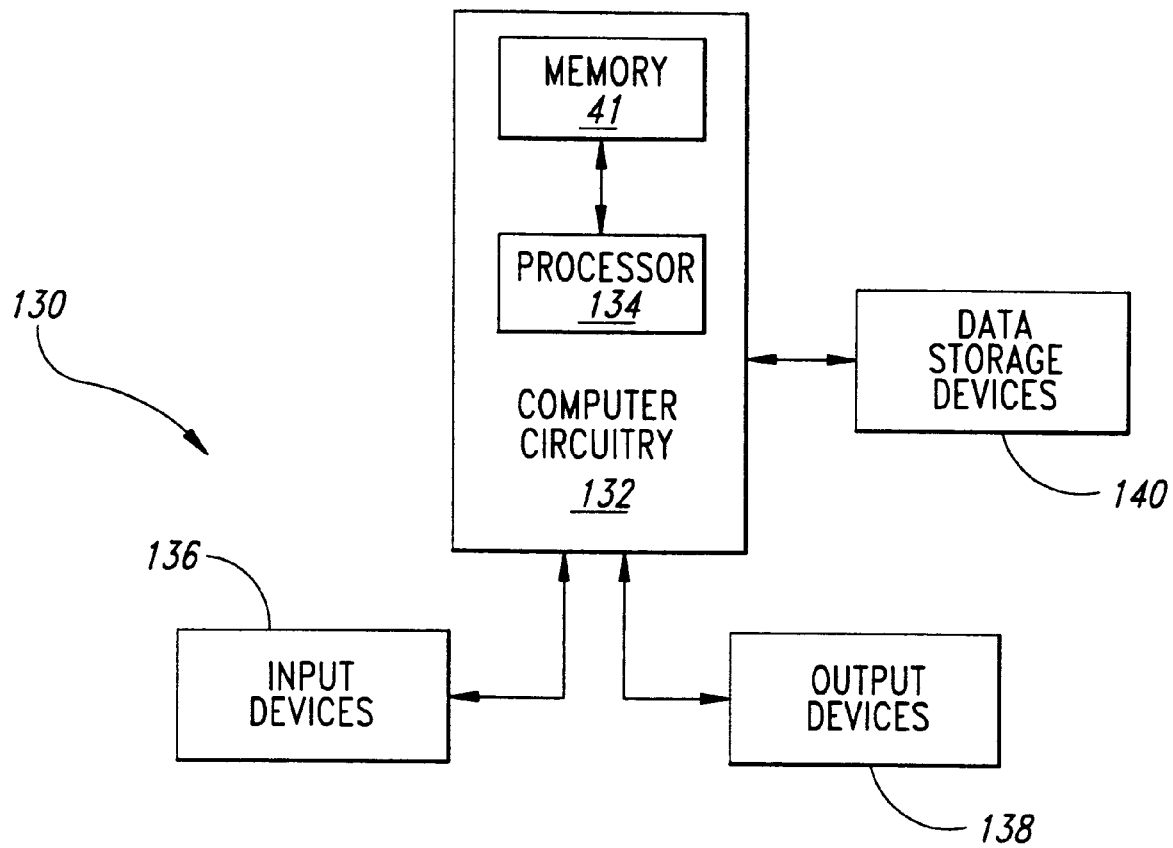
FIG. 5 is a block diagram of an electronic system that incorporates the memory circuit of FIG. 4.

FIG. 5 is a block diagram of an electronic system 130, such as a computer system, that includes the memory device 41 of FIG. 4. The system 130 also includes computer circuitry 132 for performing computer functions such as executing software to perform desired calculations and tasks. The circuitry 132 typically includes a processor 134 and the memory device 41, which is coupled to the processor 134. One or more input devices 136, such as a keyboard or a mouse, are coupled to the computer circuitry 132 and allow an operator (not shown) to manually input data thereto. One or more output devices 138 are coupled to the computer circuitry 132 to provide to the operator data generated by the computer circuitry 132. Examples of such output devices 138 include a printer and a video display unit. One or more data storage devices 140 are coupled to the computer circuitry 132 to store data on or retrieve data from external storage media (not shown). Examples of the storage devices 140 and the corresponding storage media include drives that accept hard and floppy disks, tape cassettes, and compact disk read-only memories (CD-ROMs). Typically, the computer circuitry 132 includes address, data, and command buses, and a clock line that are respectively coupled to the ADDRESS, DATA, and COMMAND buses and the CLK line of the memory device 41.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A circuit, comprising:
   a memory row having a plurality of memory cells;
   a word line that is coupled to the memory cells, the word line having a front end and a back end, the word line coupled to receive a row-activate signal that propagates from the front end to the back end; and
   an enable circuit operable to prohibit a data transfer to or from a first memory cell approximately until the row-activate signal arrives at the memory cell, the enable circuit operable to prohibit a data transfer to or from another memory cell approximately until the row-activate signal arrives at the other memory cell.

2. The circuit of claim 1 wherein the memory cell is closer to the front end of the word line than the other memory cell.

3. The circuit of claim 1 wherein the enable circuit prohibits the data transfer to the other memory cell longer than the data transfer to the memory cell.

4. A circuit, comprising:
   a memory row having a plurality of memory cells;
   a word line that is coupled to the memory cells, the word line having a front end and a back end, the word line coupled to receive a row-activate signal that propagates from the front end to the back end; and
   an enable circuit operable to enable a data transfer to or from a memory cell approximately when the row-activate signal arrives at the memory cell, the enable circuit operable to enable a data transfer to or from another memory cell approximately when the row-activate signal arrives at the other memory cell.

5. The circuit of claim 4 wherein the memory cell is closer to the front end of the word line than the other memory cell.

6. The circuit of c claim 4 wherein n the enable circuit enables the data transfer to the memory cell before enabling the data transfer to the other memory cell.

7. A memory circuit, comprising:
   a power terminal;
   a row of memory cells;
   a word line that is coupled to the memory cells;
   a plurality of pairs of digit lines, at least one of the digit lines in each pair being coupled to a respective one of the memory cells;
   a plurality of sense amplifiers that each have a supply terminal and that each have first and second terminals that are coupled to a respective pair of the digit lines;
   a plurality of switches that each have a control terminal and that are each coupled between the power terminal and the supply terminal of a respective one or ones of the sense amplifiers; and
   a word-line-delay-simulation circuit that has a plurality of output terminals that are each coupled to the control terminal of a respective switch.

8. The circuit of claim 7 wherein the memory cells comprise dynamic-random-access-memory-type memory cells.

9. The circuit of claim 7 wherein the memory cells comprise static random-access-memory-type memory cells.

10. The circuit of claim 7 wherein the switches each comprise a transistor.

11. The circuit of claim 7 wherein the simulation circuit comprises a dummy word line that is approximately as long as the word line, a different point along the dummy word line coupled to each of the output terminals.

12. A memory device, comprising:
    address, data, and command busses;
    a bank of memory cells arranged in rows and columns, the columns being arranged in groups, each group including a predetermined number of columns;
    an enable terminal that is coupled to receive a sense-amplifier enable signal;
    a plurality of word lines, each of which is coupled to a respective row of memory cells, each of the word lines having a front end;
    a plurality of pairs of digit and digit-complement lines, at least one of the digit and digit-complement lines in each pair being coupled to the memory cells in a respective column to which the pair of digit and complementary lines belongs;
    an address decoder coupled to the address bus and to the front ends of the word lines;
    a read/write circuit coupled to the address decoder and to the data and data complement lines;
    a data input/output circuit coupled to the data bus and to the read/write circuit;
    a control circuit coupled to the command bus, to the address decoder, to the read/write circuit, and to the data input/output circuit;
    a plurality of sense amplifiers each having a power terminal and each having true and complement terminals that are respectively coupled to a respective pair of the digit and complementary digit lines;
    a plurality of switches each having a control terminal and each coupled between the enable terminal and a power terminal of a respective sense amplifier; and
    a word-line-delay-simulation circuit having an input terminal coupled to the address decoder and having a plurality of output terminals that are each coupled to the control terminal of a respective one of the switches, the simulation circuit operable to close the switches in sequential order when the address decoder drives an active signal level onto a selected one of the word lines, the simulation circuit starting with the switch coupled to the column group closest to the front end of the selected word line and ending with the switch coupled to the column group farthest from the front end of the selected word line.

13. The memory device of claim 12, further comprising:
    a cell plate; and
    each of the memory cells including,
       a storage capacitor having a first terminal coupled to the cell plate and having a second terminal, and
       a transistor having a control terminal coupled to a respective word line, the transistor coupled between a respective or data complement line and the second terminal of the capacitor.

14. The memory device of claim 12, further comprising:
    first and second supply terminals; and
    the memory cells each including,
       a first access transistor having a control terminal coupled to a respective word line, a first terminal coupled to a respective data line, and a second terminal,
       a second access transistor having a control terminal coupled to the respective word line, a first terminal coupled to a respective data complement line, and a second terminal,
       a first cell transistor having a control terminal coupled to the second terminal of the second access transistor, a first terminal coupled to the first supply terminal, and a second terminal coupled to the second terminal of the first access transistor, a second cell transistor having a control terminal coupled to the second terminal of the first access transistor, a first terminal coupled to the first supply terminal, and a second terminal coupled to the second terminal of the second access transistor, a first load coupled between the second terminal of the first access transistor and the second supply terminal, and a second load coupled between the second terminal of the second access transistor and the second supply terminal.

15. The memory device of claim 12, further comprising:

first and second supply terminals; and the memory cells each including,
- a first access transistor having a control terminal coupled to a respective word line, a first terminal coupled to a respective data line, and a second terminal,
- a second access transistor having a control terminal coupled to the respective word line, a first terminal coupled to a respective data complement line, and a second terminal,
- a first cell transistor having a control terminal coupled to the second terminal of the second access transistor, a first terminal coupled to the first supply terminal, and a second terminal coupled to the second terminal of the first access transistor,
- a second cell transistor having a control terminal coupled to the second terminal of the first access transistor, a first terminal coupled to the first supply terminal, and a second terminal coupled to the second terminal of the second access transistor,
- a first load transistor having a control terminal coupled to the second terminal of the second access transistor, a first terminal coupled to the second terminal of the first access transistor, and a second terminal coupled to the second supply terminal, and
- a second load transistor having a control terminal coupled to the second terminal of the first access transistor, a first terminal coupled to the second terminal of the second access transistor, and a second terminal coupled to the second supply terminal.

16. A synchronous dynamic-random-access-memory device, comprising:

address, data, and command busses;

a bank of memory cells arranged in rows and in groups of columns, each of the column groups including a predetermined number of columns;

a supply terminal;

a plurality of word lines each coupled to a respective row of memory cells, each word line having a front end;

a plurality of pairs of true data and complementary data lines, at least one of the true or complementary data lines from each pair coupled to a respective column of memory cells;

an address decoder coupled to the address bus and to the front ends of the word lines;

a read/write circuit coupled to the address decoder and to the data lines;

a data input/output circuit coupled to the data bus and to the read/write circuit;

a control circuit coupled to the command bus, to the address decoder, to the read/write circuit, and to the data input/output circuit;

a plurality of sense amplifiers each having a power terminal and each having a pair of terminals that are respectively coupled to a respective pair of true data and complementary data lines;

a plurality of transistors each having gate terminal, each of the transistors coupled between the supply terminal and the power terminals of the sense amplifiers that belong to a respective column group;

a dummy word line that is approximately the same length as the word lines, and associated parasitic components the same as the actual word line, the dummy word line having a front end that is coupled to the address decoder; and a plurality of delay elements that are each coupled between a different location of the dummy word line and the gate of a respective transistor, the location that is closest to the front end of the dummy word line coupled to the transistor that is coupled to the column group closest to the front ends of the word lines, the location that is farthest from the front end of the dummy word line coupled to the transistor that is coupled to the column group farthest from the front ends of the word lines.

17. The device of claim 16 wherein the address decoder comprises:

a plurality of word-line drivers each having an output terminal that is coupled to the front end of a respective one of the word lines; and a dummy-word-line driver having an output terminal that is coupled to the front end of the dummy word line.

18. The device of claim 16 wherein the delay elements each have an impedance that is selected to approximately match the propagation delay between the front end of the dummy word line and another location of the dummy word line to the propagation delay between a front end of a word line and another location of the word line at which a respective column intersects the word line.

19. A computer system, comprising:

a data input device;

a data output device; and computing circuitry coupled to the data input and output devices, the computing circuitry including a memory device that includes,
- a plurality of pairs of digit lines, at least one of the digit lines in each pair being coupled to a respective one of the storage cells;
- a plurality of sense amplifiers that each have a supply terminal and that each have first and second terminals that are coupled to a respective pair of the digit lines;
- a plurality of switches that each have a control terminal and that are each coupled between the power terminal and the supply terminal of a respective one or ones of the sense amplifiers; and
- a word-line-delay-simulation circuit that has a plurality of output terminals that are each coupled to the control terminal of a respective switch.

20. The computer system of claim 19 wherein the storage cells comprise DRAM storage cells.

21. The computer system of claim 19 wherein the storage cells comprise SRAM storage cells.

22. The computer system of claim 19 wherein the simulation circuit comprises:

a dummy word line that is approximately as long as the word line; and a plurality of delay elements each having a first terminal coupled to a different point of the dummy word line and having a second terminal coupled to one of the output terminals.

23. A method, comprising:

firing a word line;

waiting approximately a first signal-propagation time that exists between a front end of the word line and a location of the word line that is coupled to a memory cell;

enabling the memory cell for a data transfer after the first time has elapsed;

waiting approximately a second signal-propagation time that exists between the location and another location of the word line that is coupled to another memory cell; and enabling the other memory cell for a data transfer after the second time has elapsed.

24. The method of claim 23 wherein:

the firing comprises filing a delay circuit and the word line approximately simultaneously, the delay circuit having approximately the same delay characteristics as the word line;

the waiting a first time comprises waiting until a firing signal propagates to a location of the delay circuit that corresponds to the location of the word line; and the waiting a second time comprises waiting until the firing signal propagates to a location of the delay circuit that corresponds to the other location of the word line.

25. The method of claim 23 wherein:

the enabling the memory cell comprises activating a sense amplifier coupled to the first memory cell; and the enabling the other memory cell comprises activating a sense amplifier coupled to the other memory cell.

26. A method, comprising:

driving a first end of a row line with a signal level, the row line coupled to a row of memory cells;

accessing one of the memory cells when the signal level has propagated along the row line to the memory cell; and accessing another one of the memory cells that is farther from the first end than the memory cell when the signal level has propagated to the other memory cell.

27. The method of claim 26 wherein:

the accessing one of the memory cells comprises enabling a sense amplifier coupled to the memory cell; and the accessing another one of the memory cells comprises enabling a sense amplifier coupled to the other memory cell.

28. The method of claim 26, further comprising:

simulating the propagation of the signal level from the first end to a second end of the row line;

wherein the accessing one of the memory cells comprises accessing the memory cell when the simulated propagation indicates that the signal level has propagated to the memory cell; and wherein the accessing another one of the memory cells comprises accessing the other memory cell when the simulated propagation indicates that the signal level has propagated to the other memory cell.

29. A method, comprising:

driving a first end of a row line with a signal level, the row line coupled to a row of memory cells;

denying access to one of the memory cells until the signal level has propagated along the row line to the memory cell; and denying access to another one of the memory cells that is farther from the first end than the memory cell until the signal level has propagated to the other memory cell.

30. The method of claim 29 wherein:

the denying access to one of the memory cells comprises disabling a sense amplifier coupled to the memory cell; and the denying access to another one of the memory cells comprises disabling a sense amplifier coupled to the other memory cell.

31. The method of claim 29, further comprising:

simulating the propagation of the signal level from the first end to a second end of the row line;

wherein the denying access to one of the memory cells comprises denying access to the memory cell until the simulated propagation indicates that the signal level has propagated to the memory cell; and wherein the denying access to another one of the memory cells comprises denying access to the other memory cell until the simulated propagation indicates that the signal level has propagated to the other memory cell.

32. A method, comprising:

changing a signal provided to a front end of a word line from a first state to a second state;

enabling one group of columns when the change occurs at a location of the word line that is approximately the same distance from the front end as the column within the group that is farthest from the front end; and enabling another group of columns when the change occurs at a location of the word line that is approximately the same distance from the front end as the column within the other group that is farthest from the front end.

33. The method of claim 32 wherein:

the enabling a group comprises activating a group of sense amplifiers that are coupled to the group of columns; and the enabling another group comprises activating a group of sense amplifiers that are coupled to the other group of columns.

34. The method of claim 33 wherein:

the groups of columns each comprise multiple columns; and the groups of sense amplifiers each comprise multiple sense amplifiers.

35. The method of claim 32 wherein the groups of columns each comprise multiple columns.

36. A method, comprising:

firing a word line and a propagation-delay-simulation line with respective row and simulation signals at approximately the same time, the simulation line having a plurality of simulation locations;

activating a sense amplifier when the simulation signal arrives at a simulation location of the simulation line, the simulation signal arriving in a first time that approximately equals the time it takes the row signal to arrive at a location of the word line to which a memory cell is coupled, the memory cell coupled to the sense amplifier by a column line; and activating another sense amplifier when the simulation signal arrives at another simulation location of the simulation line, the simulation signal arriving at the other simulation location in a second time that approximately equals the time it takes the row signal to arrive at a location of the word line to which another memory cell is coupled, the other memory cell coupled to the other sense amplifier by another column line.

37. The method of claim 36 wherein:

the activating a sense amplifier comprises activating the sense amplifier when a capacitance that is coupled to the simulation location charges to an active signal level; and the activating another sense amplifier comprises activating the other sense amplifier when another capacitance that is coupled to the other simulation location charges to the active signal level.

38. The method of claim 36 wherein the activating the sense amplifiers comprise coupling the first and second sense amplifiers to a supply voltage.

39. A synchronous dynamic-random-access-memory device, comprising:

address, data, and command busses;

a bank of memory cells arranged in rows and in groups of columns, each of the column groups including a predetermined number of columns;

a supply terminal;

a plurality of word lines each coupled to a respective row of memory cells, each word line having a front end;

a plurality of pairs of true data and complementary data lines, at least one of the true or complementary data lines from each pair coupled to a respective column of memory cells;

an address decoder coupled to the address bus and to the front ends of the word lines;

a read/write circuit coupled to the address decoder and to the data lines;

a data input/output circuit coupled to the data bus and to the read/write circuit;

a control circuit coupled to the command bus, to the address decoder, to the read/write circuit, and to the data input/output circuit;

a plurality of sense amplifiers each having a power terminal and each having a pair of terminals that are respectively coupled to a respective pair of true data and complementary data lines;

a plurality of transistors each having gate terminal, each of the transistors coupled between the supply terminal and the power terminals of the sense amplifiers that belong to a respective column group;

a dummy word line that is approximately the same length as the word lines, the dummy word line having a front end that is coupled to the address decoder; and a plurality of delay elements that are each coupled between a different location of the dummy word line and the gate of a respective transistor, the location that is closest to the front end of the dummy word line coupled to the transistor that is coupled to the column group closest to the front ends of the word lines, the location that is farthest from the front end of the dummy word line coupled to the transistor that is coupled to the column group farthest from the front ends of the word lines.

40. The device of claim 39 wherein the address decoder comprises:

a plurality of word-line drivers each having an output terminal that is coupled to the front end of a respective one of the word lines; and a dummy-word-line driver having an output terminal that is coupled to the front end of the dummy word line.

41. The device of claim 39 wherein the delay elements each have an impedance that is selected to approximately match the propagation delay between the front end of the dummy word line and another location of the dummy word line to the propagation delay between a front end of a word line and another location of the word line at which a respective column intersects the word line.

* * * * *

UNITED STATES PATENT AND TRADEMARK OFFICE
CERTIFICATE OF CORRECTION

PATENT NO. : 5,901,092
DATED : May 4, 1999
INVENTOR(S) : Tran

It is certified that error appears in the above-identified patent and that said Letters Patent is hereby corrected as shown below:

| | | |
|---|---|---|
| Column 3, lines 52, 54 | "VSA" | -- $V_{SA}$ -- |
| Column 7, line 34 | "c claim" | -- claim -- |
| Column 7, line 34 | "wherein n the" | -- wherein the -- |
| Column 11, line 16 | "filing" | -- firing -- |

Signed and Sealed this

Twenty-ninth Day of May, 2001

Attest:

NICHOLAS P. GODICI

*Attesting Officer*  *Acting Director of the United States Patent and Trademark Office*